(12) United States Patent  
Groen et al.

(10) Patent No.: US 7,109,809 B1
(45) Date of Patent: Sep. 19, 2006

(54) METHOD AND CIRCUIT FOR REDUCING VCO NOISE

(75) Inventors: Eric D. Groen, Ankeny, IA (US); Charles W. Boecker, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 195 days.

(21) Appl. No.: 10/659,819

(22) Filed: Sep. 11, 2003

(51) Int. Cl.
*H03B 25/00* (2006.01)

(52) U.S. Cl. ............... 331/57; 331/177 R; 331/183; 331/1 A; 331/17

(58) Field of Classification Search ............ 331/57, 331/177 R, 183, 1 A, 17, 176, 66; 327/156, 327/159
See application file for complete search history.

(56) References Cited

U.S. PATENT DOCUMENTS

| | | | | |
|---|---|---|---|---|
| 5,764,110 | A | * | 6/1998 | Ishibashi .................. 331/57 |
| 6,031,429 | A | * | 2/2000 | Shen ........................ 331/17 |
| 6,597,614 | B1 | * | 7/2003 | Nam et al. .................. 365/222 |
| 6,683,502 | B1 |   | 1/2004 | Groen et al. |

OTHER PUBLICATIONS

U.S. Appl. No. 10/660,062, filed Sep. 11, 2003, Groen et al.
U.S. Appl. No. 10/659,803, field Sep. 11, 2003, Black et al.
U.S. Appl. No. 10/659,971, filed Sep. 11, 2003, Boecker et al.
Kamran Iravani et al.; "Clock and Data Recovery for 1,25Gb/s Ethernet Transceiver in 0.35um CMOS"; IEEE 1998 Custom Integrated Circuits Conference; pp. 261-264.
John G. Maneatis; "Low-Jitter Process-Independent DLL and PLL Based on Self-Biased Techniques"; 1996 IEEE; pp. 1723-1732.

* cited by examiner

*Primary Examiner*—Michael B. Shingleton
(74) *Attorney, Agent, or Firm*—Timothy W. Markison; Kim Kanzazki

(57) ABSTRACT

A calibrated VCO for use in a phase-locked loop includes a low frequency calibration block for setting a bias signal for a ring oscillator to a center point to prompt the ring oscillator to generate an oscillation that is in the middle of its output frequency range and a high frequency VCO gm stage for generating an adjustment calibration signal that is added or subtracted to and from the bias signal created by the low frequency calibration block. A low pass filter coupled between the gates of a current mirror of the low frequency calibration block operates to filter noise and interference generated within the low frequency calibration block. Additionally, the magnitude of the bias signal produced by the low frequency calibration block is significantly greater than the adjustment bias signal generated by the high frequency VCO gm stage.

20 Claims, 10 Drawing Sheets programmable logic device 10 programmable multi-gigabit transceivers 14-28 programmable multi-gigabit transceivers 14-28 programmable receive PMA module 40 programmable transmit PMA module 38

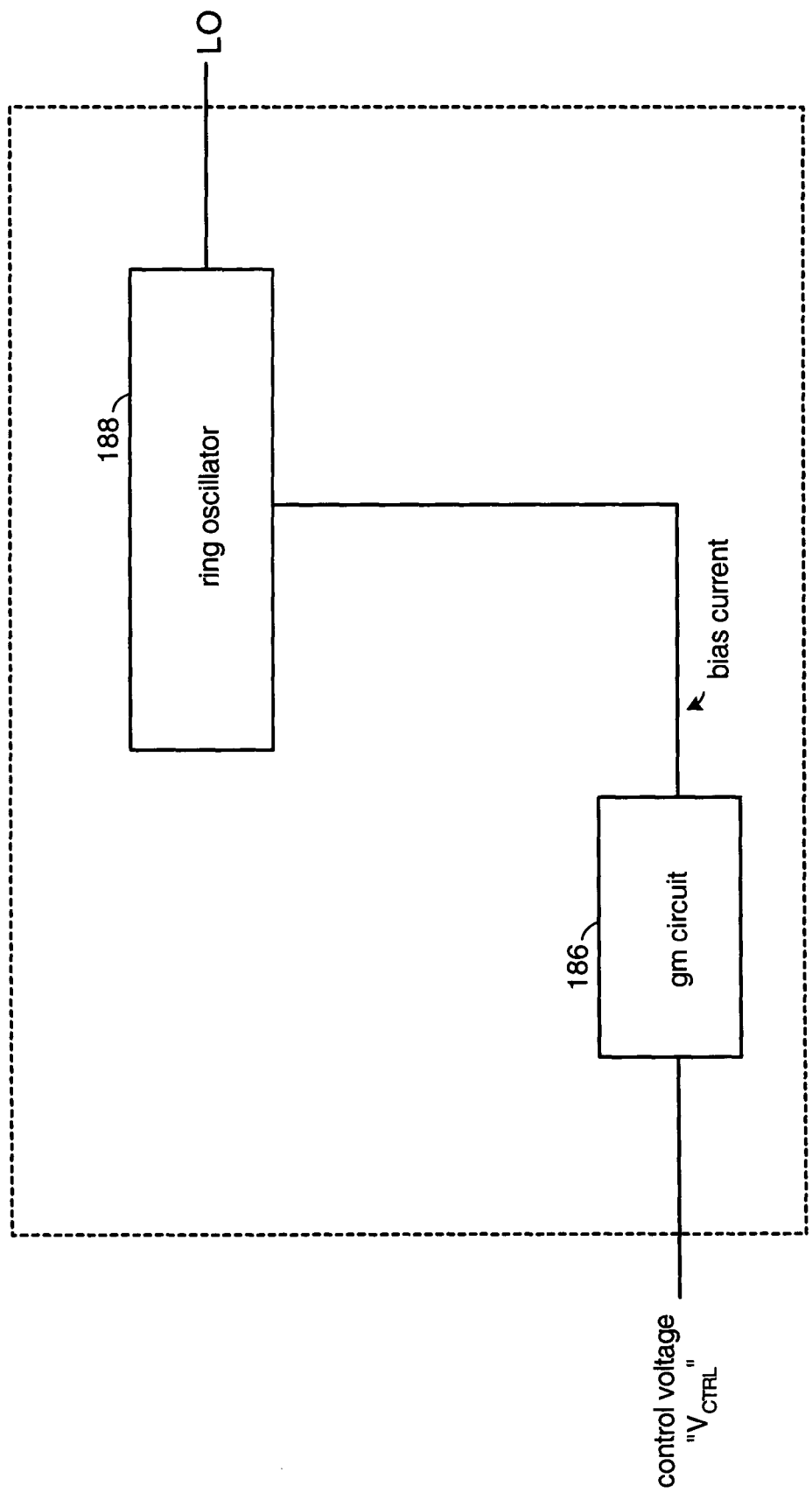
Figure 5  prior art VCO 184

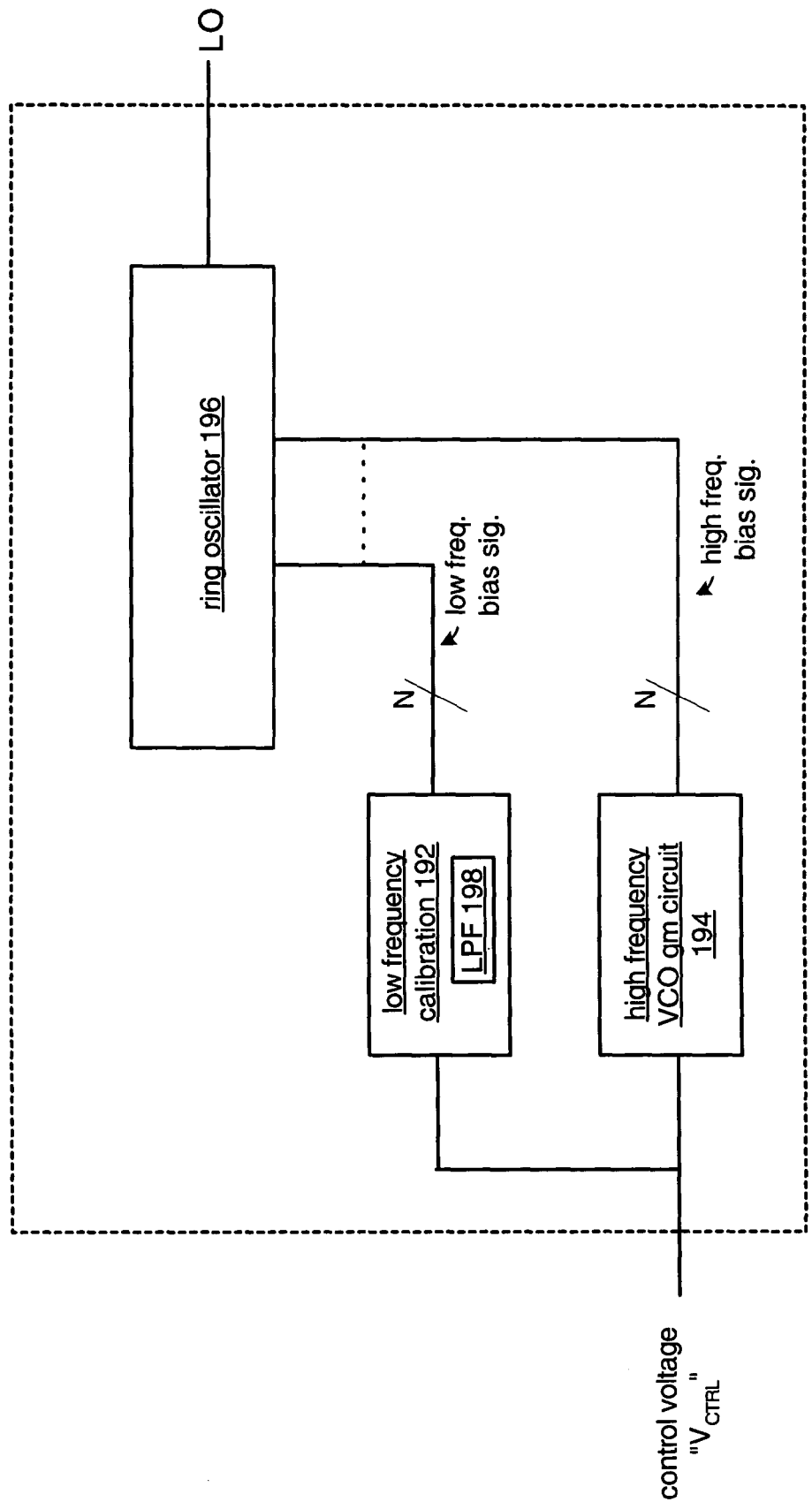
Figure 6  calibrated VCO 190 calibrated
VCO frequency
response curve circuit for calibrating VCO

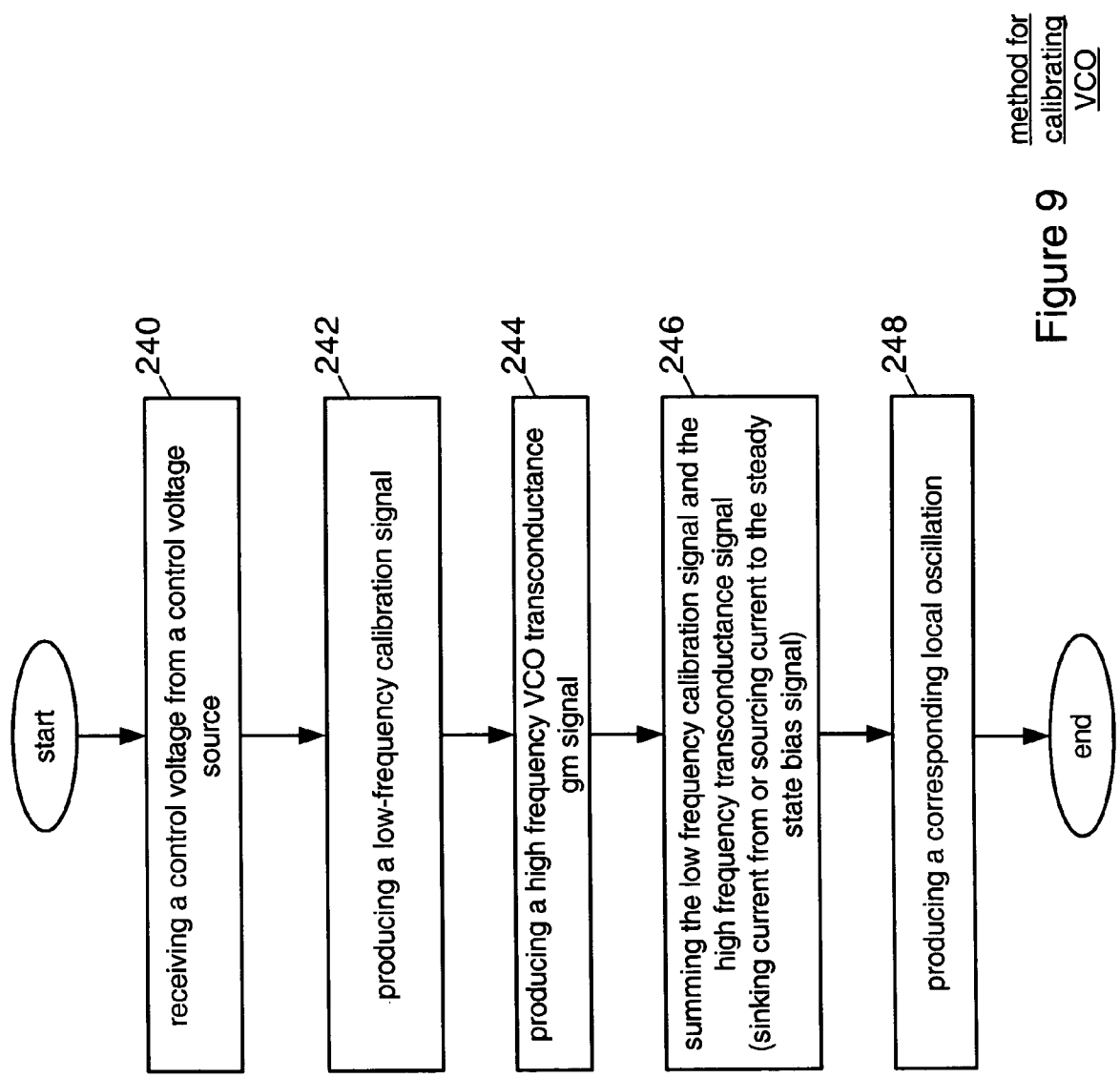

METHOD AND CIRCUIT FOR REDUCING VCO NOISE

BACKGROUND OF THE INVENTION

1. Technical Field of the Invention

This invention relates generally to communication systems and more particularly to high speed serial data transmissions.

2. Description of Related Art

Communication systems are known to transport large amounts of data between a plurality of end user devices, which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, requires 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for a feedback loop of the recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver may operate without excessive jitter performance and/or noise performance.

A further alternative for high-speed serial transceivers is to use an IC technology that inherently provides for greater speeds. For instance, switching from a Complementary Metal Oxide Semiconductor (CMOS) process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for wide spread use.

Modern communication systems, including high data rate, wire lined and wireless communication systems, typically include a phase locked loop for generating an oscillation that is used to drive clock rates, set transmission frequencies, and for down-converting received radio frequency transmissions to baseband frequencies. While there are many different designs for generating a clock or reconstructing a clock from a received data signal, the designs typically involve circuitry that increases or decreases a bias signal to a device that generates the local oscillation. Noise and interference, however, often affect the magnitude of a bias signal thereby resulting in local oscillations whose frequencies are not as accurate as desired. What is needed, therefore, is an apparatus and method that provide accurate or improved local oscillation signals by eliminating or reducing noise that contribute to error.

BRIEF SUMMARY OF THE INVENTION

A voltage controlled oscillator (VCO) of a phase locked loop (PLL) includes a ring oscillator for producing an oscillation and circuitry that calibrates the ring oscillator in a manner that reduces the affects of interference and noise upon a bias signal magnitude and therefore upon an output local oscillation. The preferred embodiment of the VCO includes a low frequency calibration circuit that produces a steady state low frequency bias signal to the ring oscillator and a high frequency VCO transconductance stage that produces a high frequency bias signal to the ring oscillator. The high frequency bias signal is an adjustment bias signal to the low frequency bias signal and is superimposed therewith. Stated differently, the low frequency bias signal compensates for error due to process variations, temperature change and corresponding operational characteristics, and other similar types of error while the high frequency bias signal is added to allow the PLL to adjust the VCO to track the reference clock under ordinary PLL operations.

In the described embodiment of the invention, both the low frequency calibration circuit and the high frequency VCO transconductance stage are coupled to receive a control voltage. The low frequency calibration circuit generates a steady state bias signal for the ring oscillator based upon the magnitude of the control voltage, while the high frequency VCO transconductance stage sinks or sources current from the bias signal according to changes in the control voltage magnitude.

The low frequency calibration circuit is formed to provide high levels of gain and to be significantly larger than the bias signal produced by the high frequency VCO transconductance stage. In one embodiment of the invention, the low frequency calibration circuit generates a bias signal whose magnitude is approximately 10 times greater than a magnitude of the high frequency bias signal. Further, because the low frequency calibration circuit comprises a low pass filter that is coupled as close as possible to the ring oscillator (electrically close), the noise introduced into the bias signal is only introduced in the high frequency VCO transconductance stage. Because, however, the relative magnitude of the high frequency bias signal is so much smaller than the low frequency bias signal, the error introduced therefrom is proportionately very small, thereby minimizing the introduction of error into the local oscillation. Generally, because the low frequency calibration circuit includes a low pass filter, and because of the scaling between the low frequency bias signal and the high frequency bias signal, error due to noise and interference is minimized.

A method of the present invention includes producing an oscillation by receiving a control voltage from a control voltage source and by producing a steady state bias signal and an adjustment bias signal responsive to the control voltage magnitude. The adjustment bias signal and the steady state bias signal are then summed to create a bias signal that results in a corresponding local oscillation. As one aspect of the present invention, the steady state bias signal has a magnitude that is at least a multiple of the adjustment bias signal in terms of magnitude. Further, the steady state bias signal is filtered thereby resulting in the introduction of noise only from the adjustment bias signal. In one embodiment, the multiple is equal to at least five.

With respect to the adjustment bias signal, the invention includes either sinking current from a node carrying the steady state bias signal or sourcing current into the node that carries the steady state bias signal. Accordingly, biased differential current mirror circuitry operates to sink or source the current to adjust the steady state bias signal level to produce a corresponding adjustment in an oscillation of a ring oscillator that is coupled to receive the bias signal.

The preferred embodiment of the VCO, as stated before, may be used for a number of applications. Typically, such VCO is used as a part of a phase-lockedphase locked loop. Accordingly, a preferred embodiment of the phase-locked loop comprises a phase frequency detector that generates an adjustment signal based on the relative difference in phase or frequency of two signals, a charge pump that is coupled to receive the control signals from the phase frequency detector to sink or source current from a loop filter responsive to the control signals received from the phase frequency detector and a voltage controlled oscillator that is coupled to receive a voltage signal from the loop filter wherein the voltage controlled oscillator produces the local oscillation. In the described embodiment of the invention, the voltage controlled oscillator is formed as described herein so as to minimize the adverse affects of noise and interference produced within the VCO.

BRIEF DESCRIPTION OF THE DRAWINGS

FIG. 5 is a functional block diagram of a prior art voltage controlled oscillator comprising a ring oscillator and a single calibration biasing circuit;

FIG. 6 is a functional block diagram of a calibrated VCO formed according to one embodiment of the present invention;

FIG. 9 is a flowchart illustrating a method for calibrating a VCO according to one embodiment of the described invention.

DETAILED DESCRIPTION OF THE INVENTION

Figure 1:
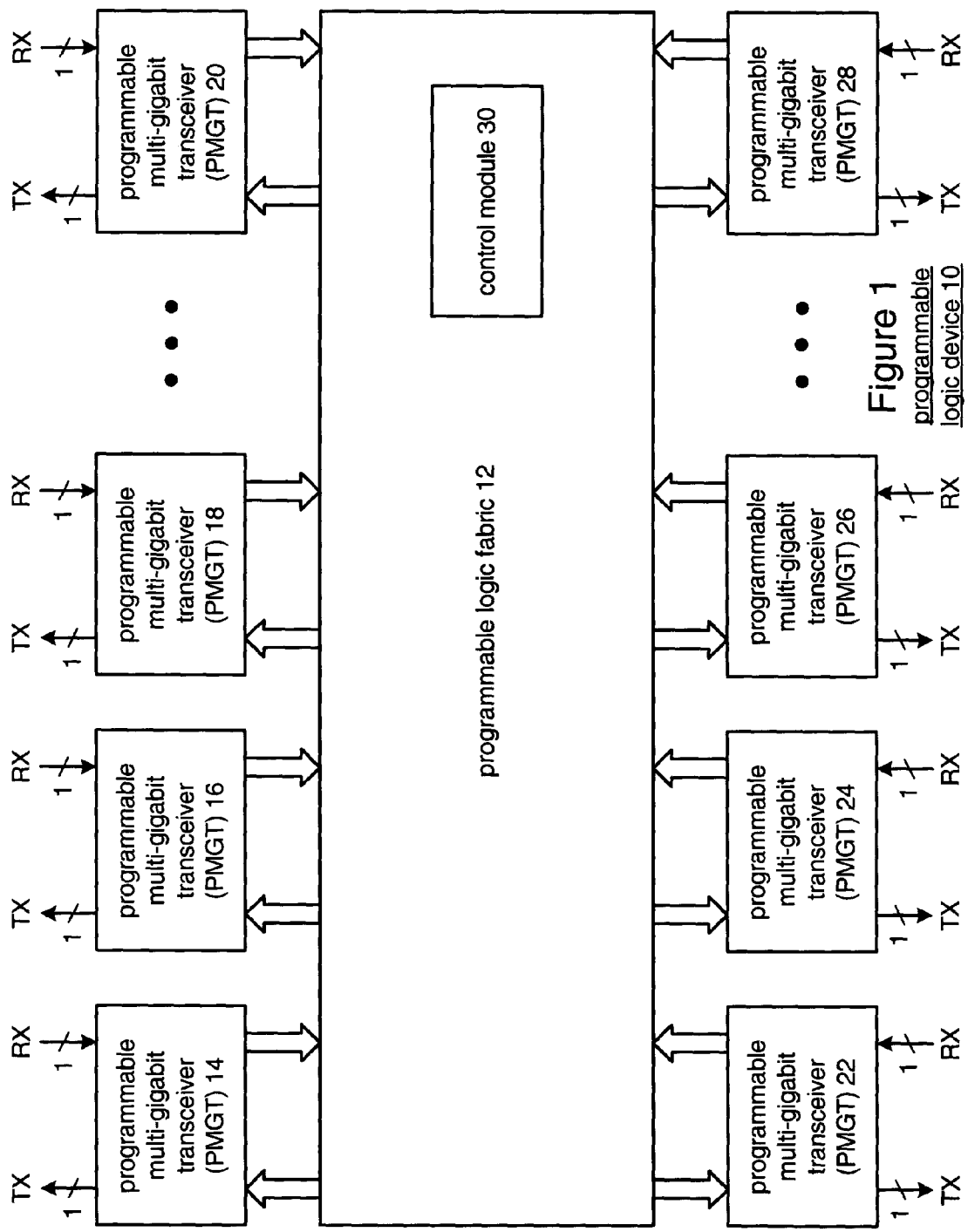
FIG. 1 is a schematic block diagram of a programmable logic device in accordance with the present invention.

FIG. 1 is a schematic block diagram of a programmable logic device 10 that includes programmable logic fabric 12, a plurality of programmable multi-gigabit transceivers (PMGTS) 14–28 and a control module 30. The programmable logic device 10 may be a programmable logic array device, a programmable array logic device, an erasable programmable logic device, and/or a field programmable gate array (FPGA). When the programmable logic device 10 is an field programmable gate array (FPGA), the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, the control module 30 generates the control signals to program each of the transmit and receive sections of the programmable multi-gigabit transceivers 14–28. In general, each of the programmable multi-gigabit transceivers 14–28 performs a serial-to-parallel conversion on received data and performs a parallel-to-serial conversion on transmit data. The parallel data may be 8-bits, 16-bits, 32-bits, 64-bits, etc.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14–18 may be bonded together such that the effective serial rate is 3 times 3.125 gigabits-per-second.

Each of the programmable multi-gigabit transceivers 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial rates of the transmit path and receive path may be programmed from 1 gigabit-per-second to tens of gigabits-per-second. The size of the parallel data in the transmit and receive sections, or paths, is also programmable and may vary from 8-bits, 16-bits, 32-bits, 64-bits, etc.

Figure 2:
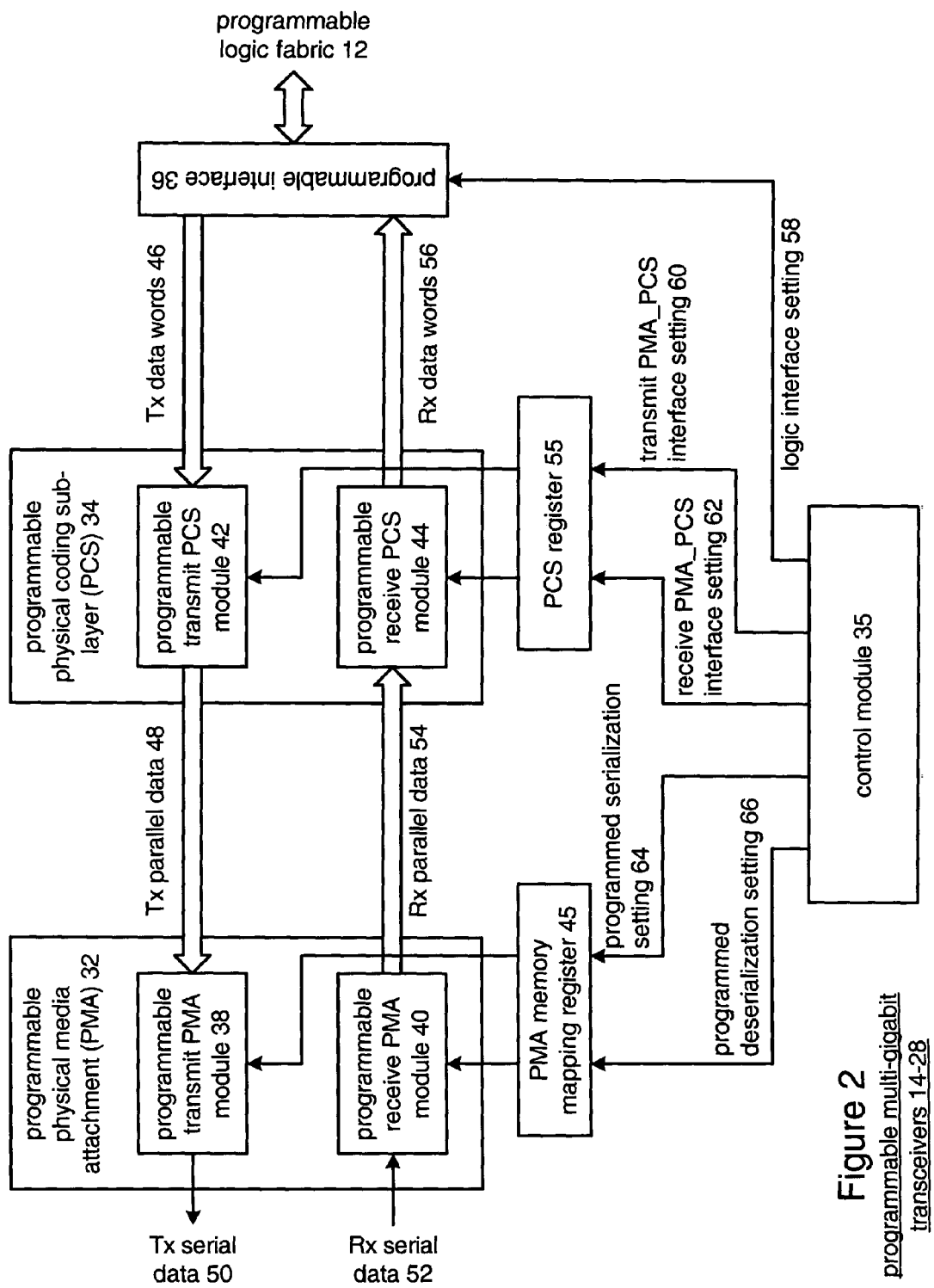
FIG. 2 is a schematic block diagram of a programmable multi-gigabit transceiver in accordance with the present invention.

FIG. 2 is a schematic block diagram of one embodiment representing one of the programmable multi-gigabit transceivers 14–28. As shown, the programmable multi-gigabit transceiver includes a programmable physical media attachment (PMA) module 32, a programmable physical coding sub-layer (PCS) module 34, a programmable interface 36, a control module 35, a PMA memory mapping register 45 and a PCS register 55. The control module 35, based on the desired mode of operation for the individual programmable multi-gigabit transceivers 14–28, generates a programmed deserialization setting 66, a programmed serialization setting 64, a receive PNA_PCS interface setting 62, a transmit PMA_PCS interface setting 60, and a logic interface setting 58. The control module 35 may be a separate device within each of the programmable multi-gigabit transceivers and/or included within the control module 30 (of FIG. 1). In either embodiment of the control module 35, the programmable logic device control module 30 determines the corresponding overall desired operating conditions for the programmable logic device 10 (of FIG. 1) and provides the corresponding operating parameters for a given programmable multi-gigabit transceiver to its control module 35, which generates the settings 58–66.

The programmable physical media attachment (PMA) module 32 includes a programmable transmit PMA module 38 and a programmable receive PMA module 40. The programmable transmit PMA module 38 is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes, etc.) and the corresponding transmission rate of the transmit parallel data 48. The programmable receive PCS module 44 converts the receive parallel data 54 into received data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and the programmable PCS module 34 may be individually programmed to support a desired data transfer rate. The data transfer rate may be in accordance with a particular standard such that the receive path, i.e., the programmable receive PMA module 40 and the programmable receive PCS module 44 may be programmed in accordance with one standard, while the transmit path, i.e., the programmable transmit PCS module 42 and the programmable transmit PMA module 38 may be programmed in accordance with another standard.

Figure 3:
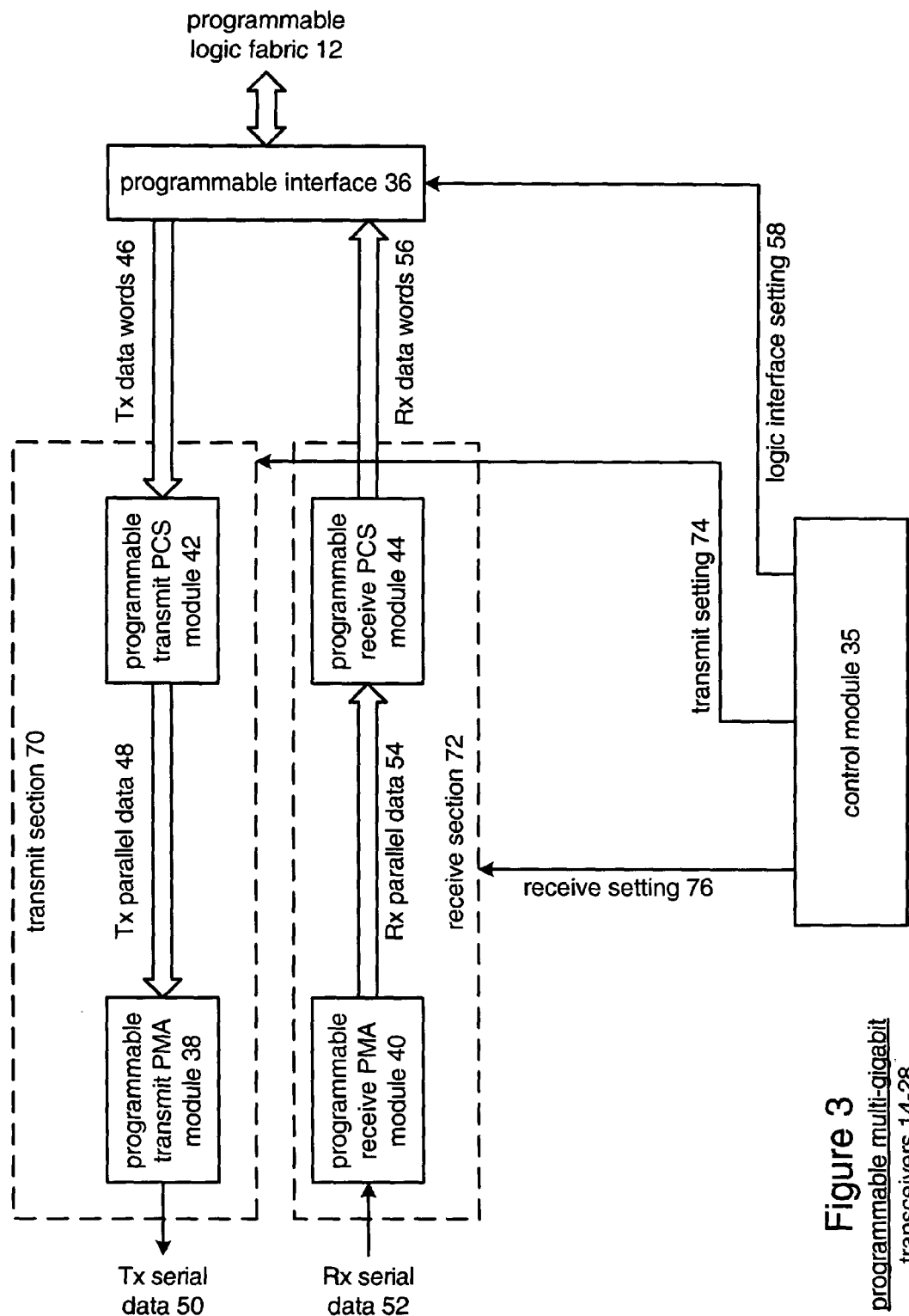
FIG. 3 is a schematic block diagram of an alternate embodiment of a programmable multi-gigabit transceiver in accordance with the present invention.

FIG. 3 illustrates an alternate schematic block diagram representing one of the programmable multi-gigabit transceivers 14–28. In this embodiment, the programmable multi-gigabit transceivers 14–28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receiver section 72 to function in accordance with one standard while programming the transmit section 70 in accordance with another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of the transmit data words 46 and the receive data words 56 to and from the programmable logic fabric 12.

Figure 4A:
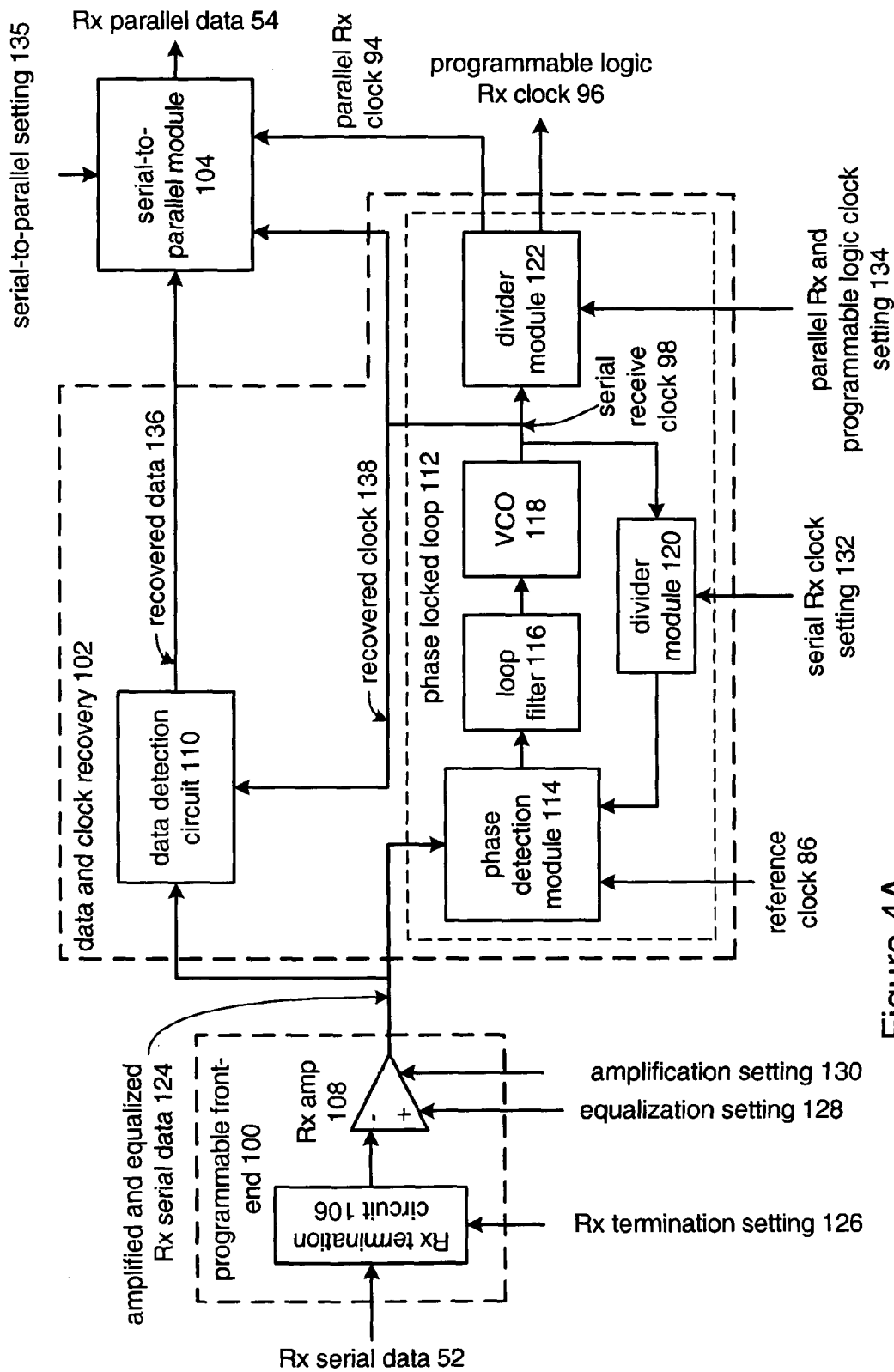
FIG. 4A is a schematic block diagram of a programmable receive physical media attachment (PMA) module in accordance with the present invention.

FIG. 4A illustrates a schematic block diagram of the programmable receive PMA module 40 that includes a programmable front-end 100, a data and clock recovery module 102, and a serial-to-parallel module 104. The programmable front-end 100 includes a receive termination circuit 106 and a receive amplifier 108. The data and clock recovery module 102 includes a data detection circuit 110 and a phase locked loop 112. The phase locked loop 112 includes a phase detection module 114, a loop filter 116, a voltage controlled oscillator (VCO) 118, a $1^{st}$ divider module 120, and a $2^{nd}$ divider module 122.

The programmable front-end 100 is operably coupled to receive the receive serial data 52 and produce amplified and equalized receive serial data 124 therefrom. To achieve this, the receive termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the termination line, and may indicate the biasing of the receiver termination circuit 106. For a more detailed discussion of the receiver termination circuit 106, refer to co-pending patent application entitled RECEIVER TERMINATION NETWORK AND APPLICATION THEREOF, by Charles W. Boecker, et al., and having the same filing date as the present application. This co-pending application is incorporated by reference, herein.

The receive termination circuit 106 further biases the receive serial data 52 and provides the bias adjusted signal to the receive amplifier 108. The gain and equalization settings of the receive amplifier 108 may be adjusted in accordance with the equalization setting 128 and the amplification setting 130, respectively. The receive amplifier 108 may be further described in co-pending patent application entitled ANALOG FRONT-END HAVING BUILT-IN EQUALIZATION AND APPLICATIONS THEREOF, by William C. Black, et al., and having a filing date the same as the present patent application. This co-pending application is incorporated by reference, herein. Note that the receive termination setting 126, the equalization setting 128, and the amplification setting 130 are part of the programmed deserialization setting 66 provided by the control module 35.

The data and clock recovery module 102 receives the amplified and equalized receive serial data 124 via the phase detection module 114 of phase locked loop 112 and via the data detection circuit 110. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current that is provided to loop filter 116. The loop filter 116 converts the current into a control voltage that adjusts the output frequency of the VCO 118. The divider module 120, based on a serial received clock setting 132, divides the output oscillation produced by the VCO 118 to produce the feedback signal. Once the amplified and equalized receive serial data 124 is received, the phase detection module 114 compares the phase of the amplified and equalized receive serial data 124 with the phase of the feedback signal from divider module 120. Based on a phase difference between the amplified and equalized receive serial data 124 and the feedback signal, a current signal is produced.

The phase detection module 114 provides the current signal to the loop filter 116, which converts it into a control voltage that controls the output frequency of the VCO 118. At this point, the output of the VCO 118 corresponds to a recovered clock 138. The recovered clock 138, which was referenced as the serial receive clock 98 in FIG. 4, is provided to the divider module 122, the data detection circuit 110 and to the serial-to-parallel module 104. The data detection circuit 110 utilizes the recovered clock 138 to produce recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs the receive parallel data 54. The serial-to-parallel setting 135, which may be part of the programmed deserialization setting 66, indicates the rate and data width of the receive parallel data 54.

Figure 4B:
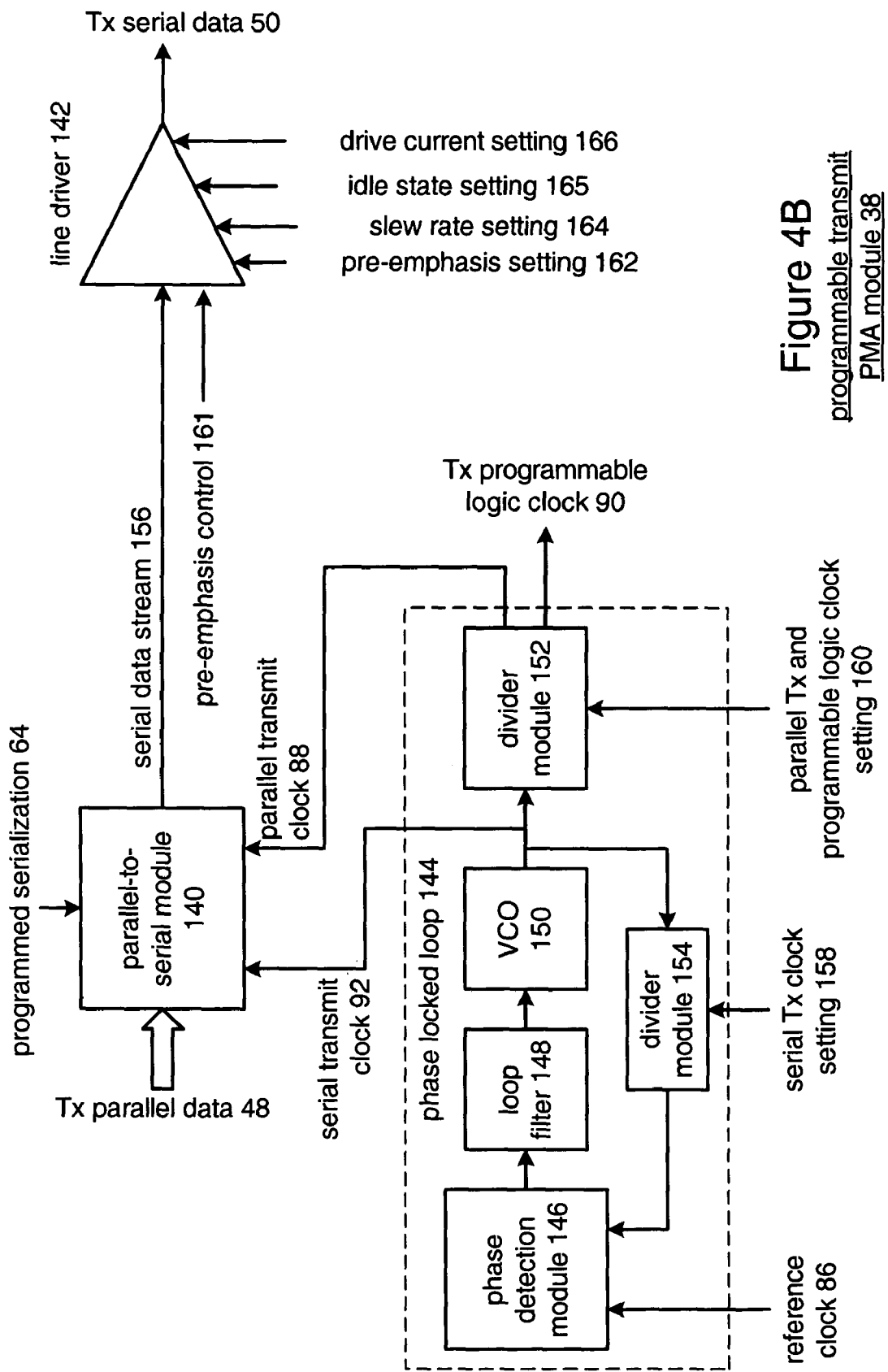
FIG. 4B is a schematic block diagram of a programmable transmit physical media attachment (PMA) module in accordance with the present invention.

FIG. 4B illustrates a schematic block diagram of a programmable transmit PMA module 38 that includes a phase locked loop 144, a parallel-to-serial module 140, and a line driver 142. The phase locked loop 144 includes a phase detection module 146, a charge pump 147, a loop filter 148, a voltage control oscillator (VCO) 150, a divider module 154, and a divider module 152.

The phase detection module 146 compares the phase and/or frequency of the reference clock 86 with the phase and/or frequency of a feedback oscillation produced by divider module 154. The phase detection module 146 generates control signals to charge pump 147 which, in turn, produces a current signal to represent the phase and/or frequency difference between the reference clock 86 and the feedback oscillation in one embodiment of the invention. The loop filter 148 converts the current signal into a control voltage that regulates the output oscillation produced by the VCO 150. Divider module 154, based on a serial transmit clock setting 158, divides the output oscillation of the VCO 150, which corresponds to a serial transmit clock 92, to produce the feedback oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces the parallel transmit clock 88 and a transmit programmable logic clock 90. The parallel transmit and programmable logic clock setting 160 may be part of the programmed serialization setting 64.

The parallel-to-serial module 140 receives the transmit parallel data 48 and produces therefrom a serial data stream 156. To facilitate the parallel-to-serial conversion, the parallel-to-serial module 140, which may include an elastic stored buffer, receives a parallel-to-serial setting to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data stream 156 from the transmit parallel data 48.

The line driver 142 increases the power of the serial data stream 156 to produce the transmit serial data 50. The line driver 142, may be programmed to adjust its pre-emphasis settings, slew rate settings, and drive setting via a pre-emphasis control signal 161, a pre-emphasis setting signal 162, a slew rate setting signal 164, an idle state setting 165 and a drive current setting 166. The pre-emphasis control signal 161, pre-emphasis setting signal 162, the slew rate setting signal 164, the idle state setting 165 and the drive current setting 166 may be part of the programmed serialization setting 64. As one of average skill in the art will appreciate, while the diagram of FIG. 4B is shown as a single-ended system, the entire system may be differential signaling and/or a combination of differential and single-ended signaling.

Further details on the line driver 142 are described in co-pending patent application entitled DAC BASED DRIVER WITH SELECTABLE PRE-EMPHASIS SIGNAL LEVELS, by Eric D. Groen et al., and having a filing date the same as the present patent application and in co-pending patent application entitled TX LINE DRIVER WITH COMMON MODE IDLE STATE AND SELECTABLE SLEW RATES, by Eric D. Groen et al. and having a filing date the same as the present patent application. These co-pending applications are incorporated by reference, herein.

FIG. 5 is a functional block diagram of a prior art voltage controlled oscillator comprising a ring oscillator and a single calibration biasing circuit. More specifically, a prior art voltage controlled oscillator (VCO 184 includes a gm circuit 186 and is coupled to receive a control voltage $V_{CTRL}$, produced by a loop filter. Gm circuit 186 produces a bias current for a ring oscillator 188. Because ring oscillator 188 is required to provide wide frequency ranges for the local oscillation produced therefrom, gm circuit 186 must be able to significantly adjust or modify the adjustment bias produced to ring oscillator 188 based upon changes in the control voltage that is received. As such, small incremental steps in the local oscillation are difficult to achieve if the system is designed to provide a wide frequency response.

Generally, a VCO, such as VCO 184, adjusts a frequency of the local oscillation in response to small changes in the received $V_{CTRL}$ signal. VCO 184 must be designed, however, to respond to large fluctuations in the value of $V_{CTRL}$ according to whether the PLL is operating in a calibration mode or is in steady state and is operating in an operational mode. On one hand, if VCO 184 is designed to have a wide frequency response range in response to $V_{CTRL}$, the sensitivity is very high thereby resulting in large swings in the local oscillation for small changes in $V_{CTRL}$. On the other hand, it is desirable, while operating in a steady state condition, to be able to adjust the local oscillation in small or fine amounts responsive to changes in $V_{CTRL}$. Accordingly, a need exists for a voltage controlled oscillator that may readily be calibrated to a steady state condition but then may be adjusted in small amounts responsive to changes in $V_{CTRL}$ in a manner that reduces error introduced into the VCO due to noise.

FIG. 6 is a functional block diagram of a calibrated VCO formed according to one embodiment of the present invention. A calibrated VCO 190 comprises a low frequency calibration block 192 and a high frequency VCO gm circuit 194 that both couple to receive a control voltage "$V_{CTRL}$". Low frequency calibration block 192 produces a low frequency bias signal to a ring oscillator 196 that produces an oscillation responsive to the low frequency bias signal. High frequency VCO gm circuit 194 produces a high frequency bias signal to ring oscillator 196 to adjust the local oscillation. In operation, the high frequency bias signal, which is much smaller in magnitude than the low frequency bias signal, in the described embodiments of the invention, is superimposed or added to the low frequency bias signal to create a net bias signal. Generally, the low frequency bias signal is for compensating for process and temperature variations while the high frequency bias signal is superimposed to set the local oscillation.

Low frequency calibration block 192 further comprises a low pass filter 198 that is for filtering noise and interference above a specified frequency. In one described embodiment of the invention, noise and interference having frequency components above one kHz are filtered.

Figure 7:
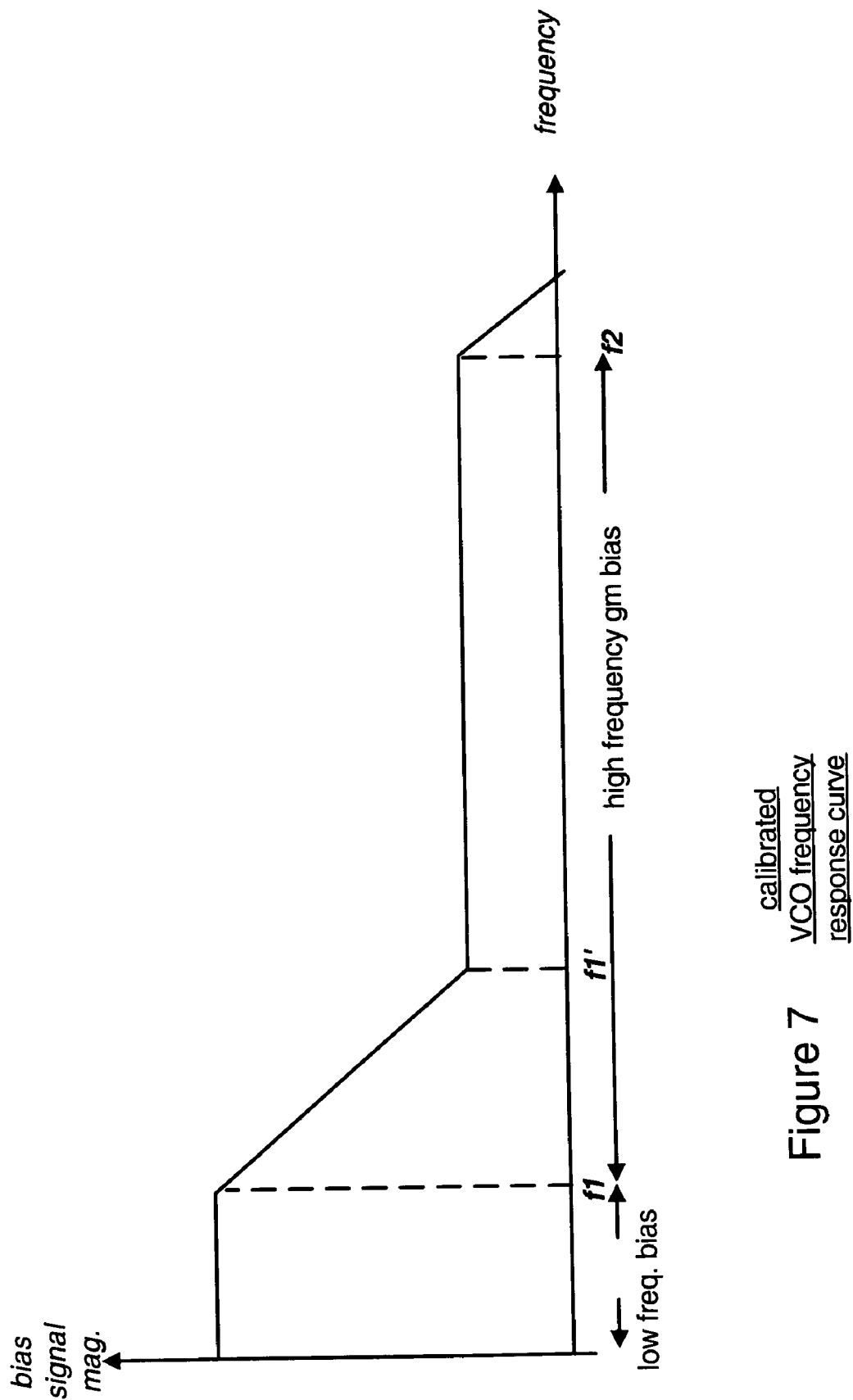
FIG. 7 is a frequency response curve for the calibrated VCO of FIG. 6.

FIG. 7 is a frequency response curve for the calibrated VCO of FIG. 6. As may be seen from the frequency response curve, the curve comprises two primary portions. A first portion is produced by the low frequency calibration and ranges in frequency from DC to a frequency f1. A second portion ranges from frequency f1 to a frequency f2 and is produced by the high frequency gm calibration stage (and partially by the low frequency bias between f1 and f1'. As may be seen in the described embodiment, a magnitude of the low frequency calibration portion is several times higher than a magnitude for the high frequency portion ranging from frequency f1, to frequency f2 above a frequency corner of a low pass filter.

Referring back to FIG. 6, and also referring to FIG. 7, therefore, it may be seen that the preferred embodiment of the calibrated VCO operates to reduce interference and noise and therefore error in the local oscillation in two ways. First, a low pass filter within low frequency calibration block 192 serves to filter out noise components above a specified frequency corner. Additionally, by designing the system such that low frequency calibration block 192 produces a magnitude signal that is several times greater in magnitude than high frequency VCO gm circuit 194, any unfiltered error produced by the high frequency VCO gm circuit 194 is small in comparison to the total magnitude of a bias signal produced to ring oscillator 196.

In operation, low frequency calibration block 192 produces a low frequency signal with relatively high bias that is intended to bias the ring oscillator at a center frequency of oscillation. The high frequency bias signal that is produced by high frequency VCO gm circuit 194, in contrast, provides an adjustment to the center bias of low frequency calibration block 192 and is a low bias signal. Thus, for small changes in $V_{CTRL}$, high frequency VCO gm circuit 194 operates to add or subtract current from the low frequency bias signal produced by low frequency calibration block 192 to produce corresponding increases or decreases in the local oscillation. Such adjustments, by the nature of the preferred embodiment of the design, are smaller in magnitude than prior art calibration schemes as discussed herein.

Figure 8:
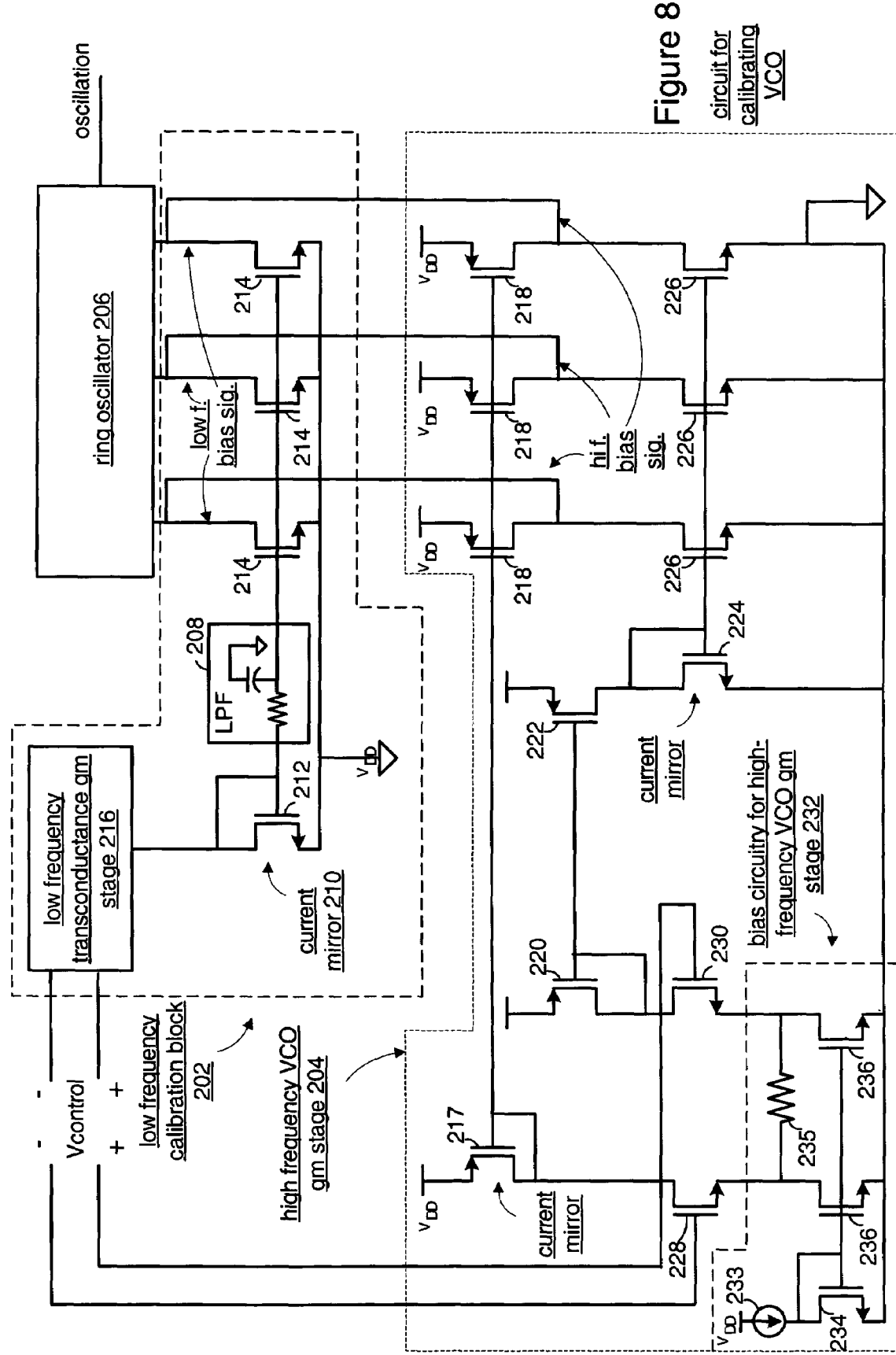
FIG. 8 is a schematic diagram of a circuit for calibrating a VCO according to one embodiment of the present invention.

FIG. 8 is a schematic diagram of a circuit for calibrating a VCO according to one embodiment of the present invention. The circuit of FIG. 8 illustrates with more detail one embodiment of the functional block diagram for the calibrated VCO of FIG. 6. As may be seen, a low frequency calibration block 202 is coupled to provide a low frequency bias signal to ring oscillator 206. Low frequency calibration block 202 further is coupled to high frequency VCO gm stage 204.

Low frequency calibration block 202 includes low pass filter 208 that is formed between the gates of a current mirror 210. The frequency response curve of FIG. 7 illustrates operation of the present invention in relation to a frequency corner defined by low pass filter 208. Current mirror 210 includes a reference MOSFET 212 that is coupled to generate a reference current for a plurality of mirror MOSFETs 214. The sources of reference MOSFET 212 and mirror MOSFETs 214 are all coupled to a common ground. Low pass filter 208, which is coupled between the gates of reference MOSFET 212 and mirror MOSFETs 214 is shown as a low pass resistor-capacitor (RC) filter, although other known low pass filters may be used in its place.

A drain of reference MOSFET 212 is further coupled to low frequency transconductance gm stage 216, which sets a bias current for reference MOSFET 212 responsive to a magnitude of $V_{CTRL}$. The current that is conducted through the channel of reference MOSFET 212 is, as is known by those of average skill in the art, reflected in each of the mirror MOSFETs 214. By "reflected", it is understood that the current in mirror MOSFETs 214 maintain a proportional relationship to the current conducted through reference MOSFET 212. Thus, for similar devices, the proportion is 1:1. If, however, the mirror MOSFETs 214 were formed to have different operating characteristics, the proportion may change.

For example, in the described embodiment of the invention, mirror MOSFETs 214 each conduct five times more current than reference MOSFET 212 and therefore each maintain a 5:1 proportional ratio. In general, current mirror 210 of low frequency calibration block 202 is designed to create a bias signal for each branch (delay element) of ring oscillator 206, as is known to one of average skill in the art, to result in an oscillation that is in the middle of its frequency range. For example, if low frequency transconductance gm stage 216 produces 1 milliamp of current through reference MOSFET 212, mirror MOSFETs 214 in each stage of the current mirror will each conduct 5 milliamps of bias current for each delay element of the ring oscillator in one embodiment of the invention. This results in ring oscillator 206 producing a 5 GHz local oscillation.

High frequency VCO gm stage 204 includes a differential amplifier pair that drive a plurality of current mirrors that, when properly biased, either sink or source current from or to, respectively, the drains of mirror MOSFETs 214 of current mirror 210. To illustrate, a reference MOSFET 217 conducts a current that is proportionately reflected in mirror MOSFETs 218. Similarly reference MOSFET 220 conducts a current that is reflected in mirror MOSFET 222 and therefore is conducted through reference MOSFET 224.

The reference current in reference MOSFET 224 is then reflected in mirror MOSFETs 226. Because reference MOSFETs 217 and 220 define the current levels in mirror MOSFETs 218 and 226, respectively, the current that is sink or sourced from the drains of mirror MOSFETs 214 is a function of the relative magnitude of the current levels of the mirror MOSFETs 218 and 226. A properly scaled set of current mirrors, therefore, can be made to operate such that current is either sinked or sourced from the drains of mirror MOSFETs 214 according to a value of $V_{CTRL}$.

Thus, the differential pair that drives these current mirrors, namely, MOSFETs 228 and 230, are coupled to receive $V_{CTRL}$ at their gates. Additionally, the bias circuitry for the high frequency VCO gm stage is shown generally at 232. The bias circuitry 232 is formed so as to bias differential MOSFETs 228 and 230 to set the current levels of reference MOSFETs 217 and 220 such that current mirrors may be sinked or sourced from the drains of mirror MOSFETs 214 responsive to changes in $V_{CTRL}$.

In general it may be seen that bias circuitry 232 comprises a current source 233 coupled in series with a reference MOSFET 234 and a pair of mirror MOSFETs 236 that bias differential MOSFETs 228 and 230. Additionally, a 1 kilo-ohm resistor 235, in the described embodiment, is coupled between the sources of differential MOSFETs 228 and 230. One of average skill in the art can readily determine according to system requirements, the corresponding current levels for the current source of bias circuitry 232, as well as the device characteristics of MOSFETs 234, 236, 228, 230, etc., to provide the described operation.

Based upon the bias provided by bias circuitry 232, $V_{CTRL}$ must reach a specified magnitude to bias either differential MOSFET 228 or 230 into an operational state. Examining differential MOSFET 228, when it is biased into an "off" state, the drain of reference MOSFET 217 floats to $V_{DD}$ and reference MOSFET 217 is also "off". As $V_{CTRL}$ changes in magnitude to bias MOSFET 228 into an "on" state, the drain voltage of reference MOSFET 217 drops, thereby dropping the gate voltage and increasing the source-to-gate voltage of reference MOSFET 217.

As reference MOSFET 217 turns on harder, it conducts more current thereby causing mirror MOSFETs 218 to conduct more current as well. Because the gates of mirror MOSFETs 218 are coupled to the gate and drain of reference MOSFET 217, the source-to-gate voltage of mirror MOSFETs 218 will equal that of reference MOSFET 217, thereby causing mirror MOSFETs 218 to conduct a corresponding proportionate current level. As has been described before, factors such as relative channel and dimensions affect the proportional ratios between the mirror MOSFETs 218 and reference MOSFET 217.

Conversely, as differential MOSFET 228 tends to turn "off", differential MOSFET 230 tends to turn "on". Accordingly, as differential MOSFET 230 conducts more current, the drain and gate of reference MOSFET 220 drop in magnitude thereby increasing the source-to-gate voltage of reference MOSFET 220. Because the gate of mirror MOSFET 222 is coupled to the gate and drain of reference MOSFET 220, it produces a corresponding source-to-gate voltage and current flow as described before. As mirror MOSFET 222 turns "on" and conducts current, the gate-to-source voltage of reference MOSFET 224 is increased thereby increasing the gate-to-source voltages of mirror MOSFETs 226 to produce a corresponding increase and current flow there through.

In operation, therefore, as differential MOSFET 228 tends to turn "on", reference MOSFET 217 conducts more current, as do mirror MOSFETs 218, while at the same time, mirror MOSFETs 226 conduct less current. Accordingly, the current is forced to flow into the drain of mirror MOSFETs 214 thereby sourcing current into the drain of mirror MOSFETS 214. Because the current level of mirror MOSFETs 214 is fixed, the bias current for ring oscillator 206 decreases by a corresponding amount thereby decreasing the frequency of the local oscillation.

Conversely, when differential MOSFET 228 tends to turn "off" and differential MOSFET 230 tends to turn "on", the current through MOSFETs 220, 222, 224 and mirror MOSFETs 226 tend to turn "on". Thus, as reference MOSFET 217 conducts less current, while mirror MOSFETs 226 conduct more current, current is drawn from the drains of mirror MOSFETs 214, thereby sinking bias current thereby increasing the total bias current level for ring oscillator 206 and increasing the frequency of the oscillation.

FIG. 9 is a flowchart illustrating a method for calibrating a VCO according to one embodiment of the described invention. More particularly, the method of FIG. 8 may be considered with the embodiment shown in FIG. 6 for the calibrated VCO and the frequency response curve of FIG. 7. Initially, the method includes receiving a control voltage from a control voltage source (step 240). For example, the control voltage may be received from a loop filter, such as loop filter 116 of FIG. 4A. Responsive to receiving the control voltage, the method includes producing a low frequency calibration signal (step 242). In the described embodiment of the invention, the low frequency calibration signal is one that is designed to prompt the ring oscillator to produce an oscillation that is centered in terms of its frequency range.

The invention further includes, based on the control voltage that was received, producing a high frequency VCO transconductance gm signal (step 244). The high frequency VCO transconductance gm signal is a bias adjustment signal that is to be superimposed or summed with the low frequency calibration signal. Accordingly, the next step of the invention includes summing the low frequency calibration signal and the high frequency transconductance signal to produce a net bias signal and a corresponding local oscillation (step 246). Thus, the final step includes producing a corresponding local oscillation (step 248).

In the described embodiment, the low frequency calibration signal is one that prompts the VCO, and more particularly, the ring oscillator of the VCO, to produce an oscillation that is centered within its operational frequency band. Accordingly, the high frequency VCO transconductance gm signal is added to the low frequency calibration signal to either increase or decrease the bias signal, thereby increasing or decreasing the local oscillation. In an alternate embodiment of the invention, however, the low frequency calibration signal is set to a maximum frequency of the local oscillation frequency range and the high frequency VCO transconductance gm signal is used solely to reduce the bias signal and thereby the corresponding local oscillation. While such a design may work, such an approach consumes more power and is therefore less efficient.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A voltage controlled oscillator (VCO), comprising:
   a ring oscillator for producing an oscillation based on a low frequency bias signal and a high frequency bias signal;
   a low frequency calibration circuit coupled to produce the low frequency bias signal based on a control voltage;
   a low pass filter coupled to filter noise received by and produced within the low frequency calibration circuit; and
   a high frequency VCO transconductance stage operably coupled to generate the high frequency bias signal based on the control voltage.

2. The VCO of claim 1 wherein the ring oscillator is coupled to receive the low frequency bias signal and the high frequency bias signal and further wherein the ring oscillator produces an oscillation having an output frequency corresponding to a sum of the low and high frequency bias signals.

3. The VCO of claim 2 wherein the low frequency bias signal has a magnitude that is at least twice as large as a magnitude of the high frequency bias signal.

4. The VCO of claim 1 wherein the low frequency calibration circuit further includes a current mirror having a plurality of stages that equals the number of delay elements within the ring oscillator, the current mirror for producing a steady state bias signal to each delay element of the ring oscillator.

5. The VCO of claim 4 wherein the low frequency calibration circuit further includes a low frequency transconductance stage for generating current having a current level that is responsive to the control voltage, which current level defines a bias current through each stage of the current mirror of the low frequency calibration circuit.

6. The VCO of claim 5 wherein the low pass filter is coupled between gates of a reference device and each of the mirror devices of the current mirror.

7. The VCO of claim 1 wherein the high frequency VCO transconductance stage further includes a differential transconductance stage further including a plurality of multi-stage current mirror stages, wherein a magnitude and a polarity of the control voltage results in a corresponding amount of current being sourced or sinked from the low frequency bias signal.

8. The VCO of claim 7 wherein the low frequency calibration circuit and the high frequency VCO transconductance stage both adjust a magnitude of the bias signal.

9. A method for producing an oscillation, comprising:
   receiving a control voltage;
   producing a steady state bias signal based on the control voltage;
   producing a transient bias signal responsive to the control voltage;
   summing the steady state bias signal and the transient low frequency bias signal to produce a frequency adjusted bias signal;
   producing the oscillation based on the frequency adjusted bias signal; and
   wherein the transient bias signal is produced by a differential transconductance stage coupled to a pair of current mirrors wherein an output signal from the pair of current mirrors is coupled to a node conducting the steady state bias signal to source or sink current therefrom responsive to changes in the control voltage.

10. The method of claim 9 further including filtering the steady state bias signal.

11. The method of claim 9 wherein the steps of producing transient bias signal and of summing the transient bias signal and the steady state bias signal includes sourcing additional current to be added to the steady state bias signal.

12. The method of claim 9 wherein the steps of producing the transient bias signal and of summing the transient bias signal and the steady state bias signal includes sinking current from the steady state bias signal.

13. The method of claim 9 further producing a steady state bias signal that is at least several times larger in magnitude than the transient bias signal.

14. A voltage controlled oscillator (VCO), comprising:
   a ring oscillator for producing an oscillation;
   a first biasing circuit for producing a first bias signal to the ring oscillator, which first bias signal is a steady state bias signal;
   a second biasing circuit for producing a second bias signal to the ring oscillator, which second bias signal is an adjustment bias signal to the first bias signal; and
   wherein the ring oscillator is coupled to receive the first and second bias signal and further wherein the ring oscillator produces the oscillation having a frequency based on the first and second bias signals; and
   wherein the second bias signal is a high frequency bias signal whose magnitude is a function of a received control voltage.

15. The VCO of claim 14 wherein the first biasing circuit further includes a low pass filter for filtering received noise and noise generated within the first biasing circuit.

16. The VCO of claim 15 wherein the low pass filter includes a corner frequency that is approximately one kilohertz.

17. The VCO of claim 15 wherein the first bias signal comprises a DC current.

18. The VCO of claim 15 wherein the first bias signal is a low frequency signal whose magnitude is a function of a received control voltage.

19. The VCO claim 15 wherein the first bias signal has a magnitude that is at least twice as large as the second bias signal.

20. The VCO of claim 15 wherein the first bias signal has a magnitude that is at least five times as large as the second bias signal.

* * * * *